(12) United States Patent
Zhang et al.

(10) Patent No.: US 6,566,688 B1
(45) Date of Patent: May 20, 2003

(54) COMPOUND SEMICONDUCTOR STRUCTURES FOR OPTOELECTRONIC DEVICES

(75) Inventors: Yong-Hang Zhang, Scottsdale, AZ (US); Philip Dowd, Singapore (SG); Wolfgang Braun, Berlin (DE)

(73) Assignee: Arizona Board of Regents, Phoenix, AZ (US)

( * ) Notice: Subject to any disclaimer, the term of this patent is extended or adjusted under 35 U.S.C. 154(b) by 0 days.

(21) Appl. No.: 09/856,799

(22) PCT Filed: Dec. 3, 1999

(86) PCT No.: PCT/US99/28576

§ 371 (c)(1),
(2), (4) Date: May 24, 2001

(87) PCT Pub. No.: WO00/33433

PCT Pub. Date: Jun. 8, 2000

Related U.S. Application Data

(60) Provisional application No. 60/110,718, filed on Dec. 3, 1998.

(51) Int. Cl.[7] .......................... H01L 27/15; H01L 31/12; H01L 31/153; H01L 33/00
(52) U.S. Cl. .............................. 257/85; 257/87; 257/90; 257/96; 257/99; 257/918
(58) Field of Search ................................. 257/79–103

(56) References Cited

U.S. PATENT DOCUMENTS

| | | |
|---|---|---|
| 5,719,894 A | 2/1998 | Jewell et al. |
| 5,767,535 A | 6/1998 | Bachem et al. |
| 5,825,796 A * | 10/1998 | Jewell et al. .................. 372/45 |
| 5,995,529 A * | 11/1999 | Kurtz et al. .................. 372/45 |

FOREIGN PATENT DOCUMENTS

JP 07335976 12/1995

OTHER PUBLICATIONS

C.L. Feliz, et al., Midinfrared vertical–cavity surface–emitting laser; Applied Physics Letters; Dec. 15, 1997 71(24); pp. 3483–3485.

Y.H. Zhang; Continuous wave operation of InAs/InAsxSb1–x midinfrared lasers; Applied Physics Letters; Jan. 9, 1995, 66(2); pp. 118–120.

N.A. Charykov, et al., Solid solution InxGa1–xAsySbzP1–y–z: A new material for infrared optoelectronics. Thermodynamic analysis of the conditions for obtaining solid solutions, isoperiodic to InAs and GaSb substrates, by liquid–phase epitaxy, The American Institute of Physics, Apr. 1997, 31(4), pp. 344–349.

P.Dowd, et al., 1.3 μm InGaAs/GaPAsSb light emitting diode grown on GaAs, Department of Electrical Engineering–Center for Solid State Electronics Research, Arizona State University, Tempe, Arizona, May 1999, pp489–490.

* cited by examiner

Primary Examiner—Wael Fahmy, Jr.
Assistant Examiner—Wai-Sing Louie
(74) Attorney, Agent, or Firm—Gallagher & Kennedy, P.A.; Thomas D. MacBlain

(57) ABSTRACT

A compound semiconductor device is provided that includes a substrate and an active region disposed above the substrate. The active region includes at least two different pseudomorphic layers, the first layer having the form $In_xGa_{1-x}P_yAs_zSb_{1-y-z}$, and the second layer having the form $In_qGa_{1-q}P_rAs_sSb_{1-r-s}$. The first layer includes at least In, Ga, and As, and the second layer includes at least Ga, As, and Sb. It is preferable for the substrate to be GaAs or $Al_pGa_{1-p}As$ (0<p<1), or to have a lattice constant close to or equal to that of GaA For the first layer, it is preferable if x is between 0.05 and 0.7, y is between 0 and 0.35, z is between 0.45 and 1, and 1–y–z is between 0 and 0.25. For the second layer, it is preferable if q is between 0 and 0.25 and 1–r–s is between 0.25 and 1.

47 Claims, 9 Drawing Sheets

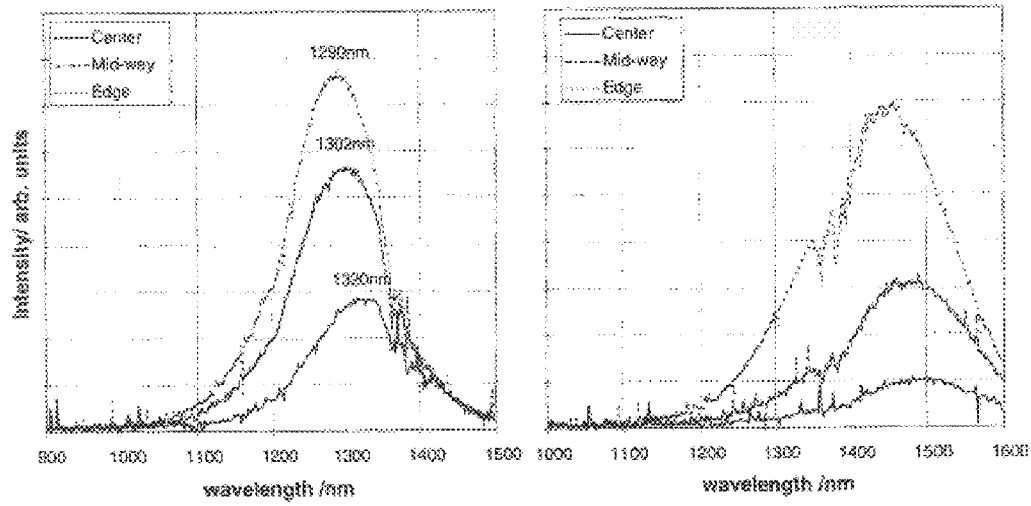
*FIG. 7A*  *FIG. 7B*
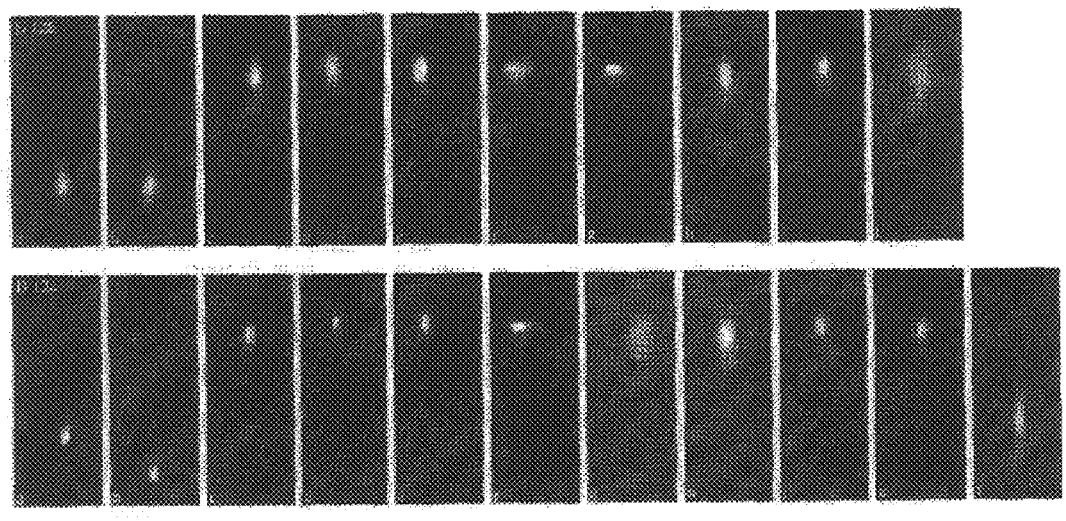
*FIG. 8*

COMPOUND SEMICONDUCTOR STRUCTURES FOR OPTOELECTRONIC DEVICES

This application claims the benefit of U.S. Provisional Application Serial No. 60/110,718, filed Dec. 3, 1998.

BACKGROUND OF THE INVENTION

This invention relates generally to the field of optoelectronic devices. More specifically, this invention relates to compound semiconductor structures for optoelectronic devices such as light-emitting diodes, photodetectors, edge-emitting lasers, and vertical-cavity surface-emitting lasers.

Semiconductor devices operating at 1.3 μm and 1.55 μm are extremely important for fiber-optic communications. Ideally the devices for these applications should operate at a single wavelength, be robust to environmental variations such as temperature, and be inexpensive to produce. To date, most work has concentrated on producing edge-emitting devices using the InP/InGaAsP material system. These devices employ special distributed feedback structures to control the spectral quality of the laser output. However, the yield of these devices can be poor. Furthermore, because these devices are made of smaller bandgap materials grown on InP, they are highly temperature-sensitive and require strict temperature control. Therefore this type of long-wavelength edge-emitting laser is usually very costly.

An alternative device which may allow single wavelength emission is a vertical-cavity surface-emitting laser (VCSEL). In general, VCSELs are light-emitting semiconductor devices comprising two distributed Bragg reflectors (DBRs), between which lies an active region composed of a material emitting the desired wavelength of light. The DBRs act as mirrors, and define a resonant cavity, and the active region acts as an optical gain medium. There may also be spacers between the active region and each DBR used to define a cavity length. The semiconductor mirror structures are usually doped to allow current flow through the active region.

There are problems associated with prior art VCSELs, some of which have been reviewed in U.S. Pat. Nos. 5,719,894 and 5,719,895 to Jewell et al., the disclosures of which are incorporated herein by reference. In general, the production of VCSELs grown using InP/InGaAsP and emitting in the region of 1.3 μm to 1.55 μm has been inhibited because of the high thermal sensitivity and poor refractive index properties of the InP/InGaAsP system. In addition, the production of efficient DBRs for InP substrates is difficult and in practice has been found to be very ineffective.

To overcome the production of poor quality mirrors based on InP, one approach has been to use wafer fusion. In this technique, the active region is grown on an InP substrate and the DBRs are grown on gallium arsenide (GaAs). These wafers are then processed and bonded together under high pressure to form a VCSEL. The drawbacks of this method are possible reliability issues because of the complex processing required and the attendant higher manufacturing cost.

To overcome the limitations of InP/InGaAsP, structures based on GaAs substrates have been proposed for vertical cavity devices. The growth of high quality active material on GaAs for 1.3 μm and 1.55 μm emission is a problem which has been investigated using a number of different approaches.

A first approach uses InGaAs quantum dots (QDs) grown on GaAs. This approach has produced photoluminescence (PL) at 1.3 μm, a resonant cavity photodiode operating at 1.27 μm, and an edge emitting quantum dot (QD) laser operating at 1.3 μm. A continuous-wave (CW), room temperature (RT), QD-based VCSEL has also been produced, but the lasing wavelength was only 1.15 μm.

A second approach uses strained GaAsSb quantum wells (QWs). This approach has produced room temperature PL at 1.3 μm and an edge-emitting laser operating at 1.27 μm. (The shorter wavelength of this laser can be attributed to gain saturation at the higher current injection levels due to the limited number of defect-free QWs which can be grown.) This approach has also produced PL wavelengths of up to 1.332 μm using GaAsSb/InGaAs bi-layer QWs, with a type-II band-edge alignment.

A third approach uses a single GaInNAs quantum well. This approach has produced room-temperature pulsed operation at an emission wavelength of 1.18 μm with a threshold current density of 3.1 kA/cm$^2$. A CW edge-emitting laser having a lasing wavelength close to 1.3 μm has also been produced when the nitrogen content of the QW is increased to 1%. Threshold currents of 108 mA have been achieved for devices with a cavity length of 800 μm and an active width of 2 μm.

These approaches all have shortcomings. First, the wavelengths produced are too short for telecommunications purposes. Second, the quantum dot devices rely on long cavities and use highly reflective facet coatings. Third, the GaInNAs approach is limited because the incorporation of nitrogen in InGaAs to form GaInNAs is technologically challenging for a number of reasons. First, there are problems in reliably incorporating more than 1% nitrogen in the active material. Second, a typical precursor used is based on hydrazine (e.g. rocket fuel), and great care must be taken because of the unstable and pyrophoric nature of the compound. Third, it is not clearly understood how the nitrogen is incorporated into the active region. Although some researchers previously thought that a quaternary alloy is formed, it is now generally believed that nitrogen is incorporated as an impurity or defect state. Such states can introduce non-radiative recombination centers which increase in number as the amount of nitrogen incorporated into the material increases. These states may cause local perturbation, or splitting of the conduction band, allowing longer-wavelength emission to be achieved. However, higher nitrogen incorporation generally shortens device lifetime, consistent with the introduction of defects.

Therefore, a need has arisen for improved semiconductor optoelectronic devices that operate at the desired telecommunications wavelengths of 1.3 μm and 1.55 μm.

SUMMARY OF THE INVENTION

In accordance with the present invention, a compound semiconductor device is provided that includes a substrate and an active region disposed above the substrate. The active region includes at least two different pseudomorphic layers, the first layer having the form $In_xGa_{1-x}P_yAs_zSb_{1-y-z}$, and the second layer having the form $In_qGa_{1-q}P_rAs_sSb_{1-r-s}$. The first layer includes at least In, Ga, and As, and the second layer includes at least Ga, As, and Sb. "Pseudomorphic" is defined as having a sufficiently low level of misfit dislocations. Each InGaPAsSb layer is pseudomorphic to the substrate. The substrate is preferably GaAs or $Al_pGa_{1-p}As$ (0<p<1), or of a material having a lattice constant close to or equal to that of GaAs. For the first layer, it is preferable if x is between 0.05 and 0.7, y is between 0 and 0.35, z is between 0.45 and 1, and 1−y−z is between 0 and 0.25. For the second layer, it is preferable if q is between 0 and 0.25 and 1−r−s is between 0.25 and 1.

Preferably, the band structure formed between the first and second layers has a type-II band-edge alignment. Preferably, the peak transition wavelength is greater than 1100 nm.

Preferably, the first layer is a well region for electrons, and the second layer is a barrier region for electrons. Preferably, both layers form quantum wells and may also form a superlattice.

In another embodiment, the active region further includes a third pseudomorphic layer. This third layer has substantially the same composition as the first layer and may be disposed on the second layer. A variation of this embodiment also includes at least one layer-pair between the second and third layers. Each layer-pair has substantially the same composition as the first and second pseudomorphic layers. Another variation includes a fourth pseudomorphic layer disposed on the third layer, the fourth layer having substantially the same composition as that of the second layer. This variation could also have at least one layer-pair between the second and third layers, each layer-pair having substantially the same composition as the first and second pseudomorphic layers.

In another embodiment, the active region could further include three additional pseudomorphic layers disposed above the second layer. The first additional layer has a composition different from that of either of the first two layers. The second additional layer has substantially the same composition as that of the second pseudomorphic layer, and the third additional layer has substantially the same composition as that of the first pseudomorphic layer.

In another embodiment, cladding layers surround the active region. Preferably, these layers are made of GaAs, $Al_tGa_{1-t}As$, or $GaAs_uP_{1-u}$, where t and u are between 0 and 1.

In another embodiment, the first pseudomorphic layer is disposed on the first cladding layer, and the second pseudomorphic layer is disposed on the first pseudomorphic layer. Preferably, this embodiment includes a third pseudomorphic layer, having substantially the same composition as the first layer, and disposed above the second layer. A variation of this embodiment may also include at least one layer-pair between the second and third layers. Each layer-pair has substantially the same composition as the first and second pseudomorphic layers. Another variation includes a fourth pseudomorphic layer disposed on the third layer, the fourth layer having substantially the same composition as that of the second layer. This variation could also have at least one layer-pair between the second and third layers, each layer-pair having substantially the same composition as the first and second pseudomorphic layers.

In another embodiment, a first cladding layer is disposed between the substrate and the active layer, and a second cladding layer is disposed above the second pseudomorphic layer. The second cladding layer and the layers disposed between the first and second cladding layers then may form a multilayer structure which could repeatedly be disposed over the initial multilayer structure.

In a further embodiment, there are two conductivity layers electrically coupled to the active region, one of a first conductivity type and the second of another conductivity type. There is also means for providing or extracting electrical current to or from the active region. Preferably, the bandgap of the conductive layers is larger than that of the layers of the active region. Preferably, an edge-emitting device is formed in which a cavity in the plane of the conductive layers forms a semiconductor-air interface through which optical emission or absorption is achieved.

In another embodiment of this device, there is a grating layer disposed above the second conductive layer. The grating layer has lines that extend over at least part of the active region and the grating layer defines an optical resonance cavity. The cavity has a resonance wavelength related to a resonance energy such that the resonance wavelength (in microns) equals 1.24 divided by the resonance energy (in eV). Preferably, the grating layer lines can be shifted by at least a quarter-wavelength, or a multiple of a quarter wavelength, to form a phase-shifted grating layer.

In another embodiment of this device, a bottom mirror is disposed beneath the active region and a top mirror is disposed above the active region. The top and bottom mirrors define an optical resonance cavity having a resonance wavelength related to a resonance energy such that the resonance wavelength (in microns) equals 1.24 divided by the resonance energy (in eV). Preferably, the top and bottom mirrors are made of alternating high refractive index and low refractive index layers. The low refractive index layers can be made of oxidized material, low refractive index dielectric material, low refractive index polymeric material, and relatively low refractive index semiconductor material, or any combination of these. The high refractive index layers can be made of oxidized material, high refractive index dielectric material, high refractive index polymeric material, and high refractive index semiconductor material, or any combination of these.

In a further embodiment, there is an aperture disposed above the active region. The aperture has two regions. In one further embodiment, one aperture region has high electrical resistance and the other aperture region has a much lower electrical resistance. In another embodiment, one aperture region has a lower refractive index than the other aperture region. In another embodiment, the first aperture region is made of predominantly oxidized material and the other aperture region is less oxidized than the first aperture region. In another embodiment, the aperture is formed by etching a pillar.

Also in accordance with the present invention are an edge-emitting laser, a resonant cavity photodetector, a resonant cavity light-emitting diode (LED), or a VCSEL each including a substrate with an active region disposed above the substrate. In each device, the active region includes at least two pseudomorphic layers. The first pseudomorphic layer has the form $In_xGa_{1-x}P_yAs_zSb_{1-y-z}$, the second pseudomorphic layer has the form $In_qGa_{1-q}P_rAs_sSb_{1-r-s}$, and the compositions of the first and second pseudomorphic layers are different. The first layer includes at least In, Ga, and As, and the second layer includes at least Ga, As, and Sb.

Also in accordance with the present invention is a compound including indium, gallium, phosphorus, arsenic, and antimony and having the form $In_xGa_{1-x}P_yAs_zSb_{1-y-z}$, in which $0<x<1, 0<y<1, 0<z<1$, and $0<1-y-z<1$ Also in accordance with the present invention is a method for fabricating a compound semiconductor device on a substrate including forming an active region disposed above the substrate, the active region including at least first and second pseudomorphic layers. The first pseudomorphic layer has the form $In_xGa_{1-x}P_yAs_zSb_{1-y-z}$, the second pseudomorphic layer has the form $In_qGa_{1-q}P_rAs_sSb_{1-r-s}$, and the compositions of the first and second pseudomorphic layers are different. The first layer includes at least In, Ga, and As, and the second layer includes at least Ga, As, and Sb. The substrate is preferably GaAs or $Al_pGa_{1-p}As$ ($0<p<1$), or of a material having a lattice constant close to or equal to that of GaAs.

By using two differently composed InGaPAsSb pseudomorphic layers in the active region, the present invention avoids the limitation of the lasing wavelength being determined by the bandgap of a single material. Wavelengths from 1.1 µm to 1.5 µm have been achieved. Other technical advantages of the present invention will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which:

FIGS. 7A and 7B are graphs showing photoluminescence spectra of devices fabricated in accordance with the present invention;

FIG. 8 are photographs showing reflection high energy electron diffraction (RHEED) measurements of two embodiments of the present invention;

DETAILED DESCRIPTION OF THE INVENTION

Figure 1A:
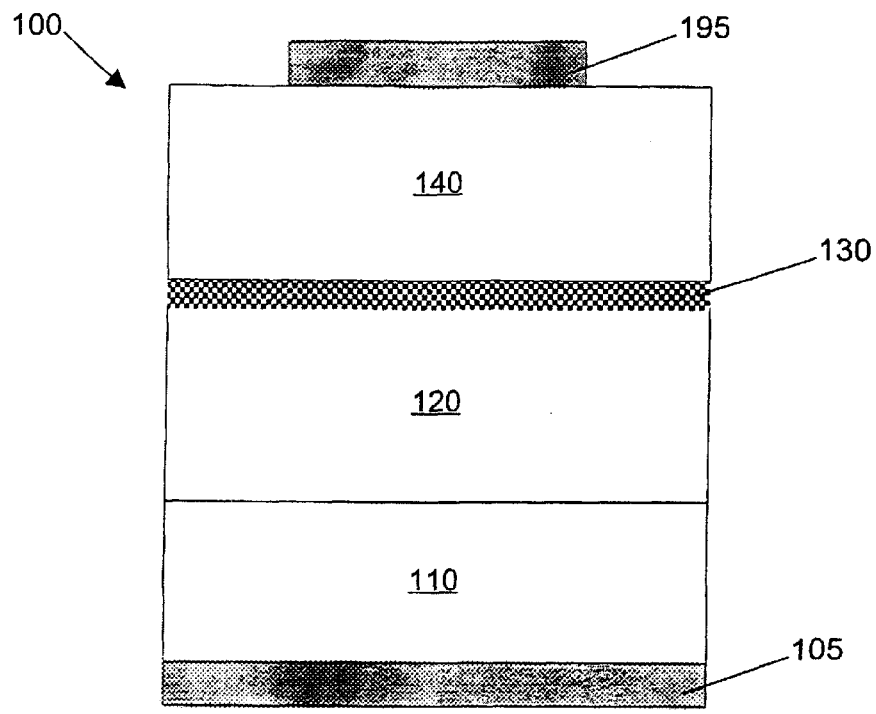
FIG. 1A is a schematic diagram of a generic optoelectronic semiconductor device in accordance with one embodiment of the present invention.

The present invention provides emission at a wavelength of at least 1.1 µm. Moreover, the invention shows a band structure having a type-II band-edge alignment. The present invention may be used in optoelectronic semiconductor devices having a structure similar to that of FIG. 1A. Device 100 includes a substrate 110 disposed on a bottom contact 105, a bottom portion 120 disposed on substrate 110, an active region 130 disposed on bottom portion 120, a top portion 140 disposed on active region 130, and a top contact 195 disposed on top portion 140.

Substrate 110 is a semiconductor, preferably GaAs or $Al_xGa_{1-x}As$ (0<x<1), which is preferably n-doped, but which may also be p-doped. (Hereinafter, unless otherwise stated, $Al_xGa_{1-x}As$ (0<x<1) will be written as "AlGaAs," where it is understood that the Group III elements Al and Ga have complementary subscripts adding up to 1.) Although preferably made of GaAs or AlGaAs, the substrate can be made of any material having a lattice constant close to or equal to that of GaAs. Bottom contact 105 is preferably an n-contact (having the same conductivity as substrate 110). Similarly, bottom portion 120 preferably has the same conductivity as substrate 110. Bottom portion 120 can include a contact layer and a guiding or graded index layer, in the case of an edge-emitting laser, or can include a bottom mirror in the case of a resonant cavity device such as an LED, a photodiode, or a VCSEL. Top portion 140 preferably has a structure symmetric to that of bottom portion 120, having the opposite conductivity as bottom portion 120 and substrate 110, and preferably including a contact layer and a guiding or graded index layer, in the case of an edge-emitting laser, or a top mirror in the case of the resonant cavity devices described above. Top contact 195 is preferably a p-contact (having the same conductivity as top portion 140). Active region 130 is where the emission or absorption of light takes place, whereas top portion 140 and bottom portion 120 are not intended to emit or absorb light.

Figure 1B:
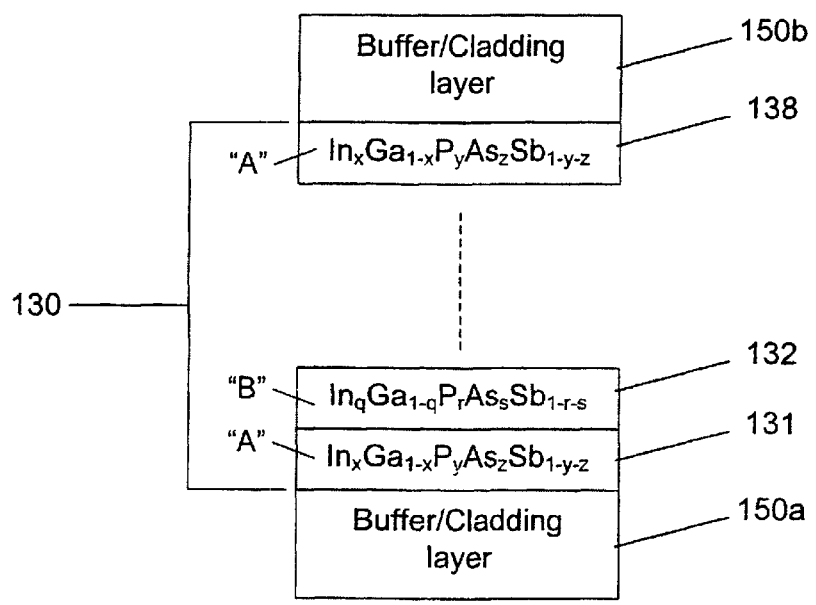
FIGS. 1B–1D are schematic diagrams showing expanded views of several embodiments of the active region of FIG. 1A.
Figure 1C:
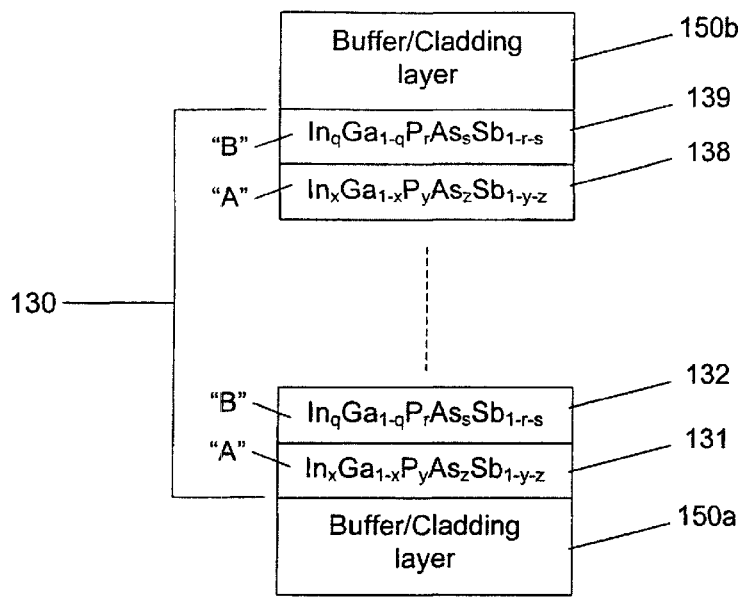
Figure 1D:
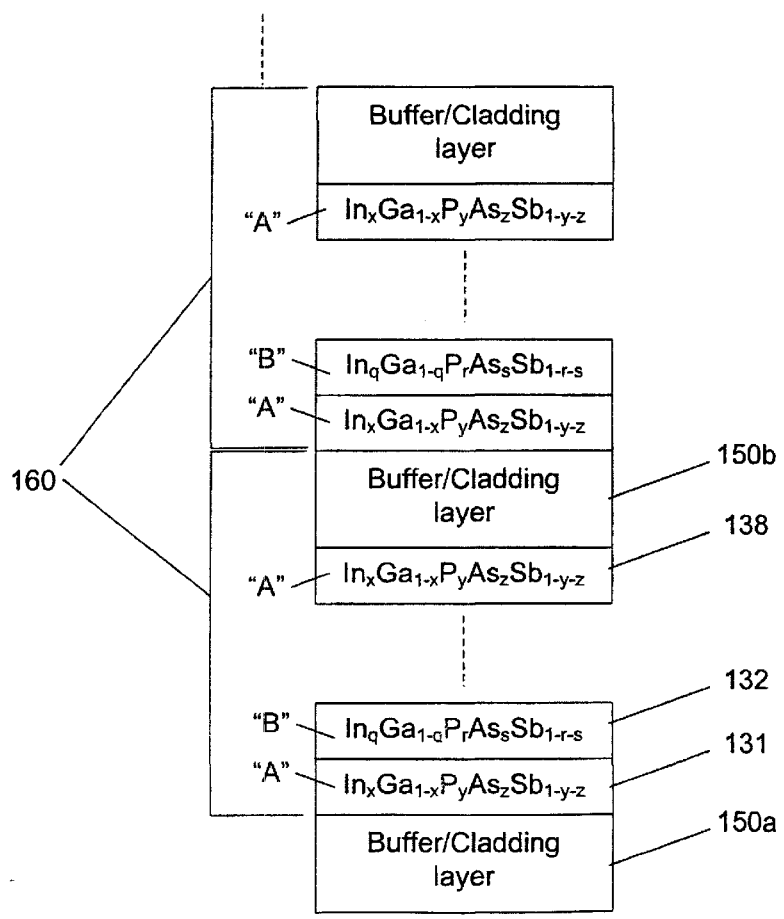

Active region 130 is magnified in FIGS. 1B–1D, and is shown as a strained InGaPAsSb-based quantum-well structure or structures embedded in buffer/cladding layers 150a, 150b. Active region 130 includes at least two InGaPAsSb layers 131, 132 having different compositions, and preferably includes at least a third layer 138 having substantially the same composition as layer 131, although it is possible for the thicknesses and stoichiometry of each of layers 131 and 132 to differ. At least In, Ga, and As should be present in the first layer, and at least Ga, As, and Sb should be present in the second layer. As shown in FIG. 1B, there will preferably be an odd number of pseudomorphic layers embedded in buffer/cladding layers 150a, 150b, especially if there are only a few pseudomorphic layers (e.g. 3 or 5). In that case, the first layer adjacent either of the buffer/cladding layers has nominal composition "A," and the next adjacent layer has nominal composition "B." Layer A acts as a well region for electrons, and layer B acts as a barrier region for electrons. There can be 0, 1, 2, or more A/B layer-pairs between layer 132 and layer 138.

Alternatively, there can be an even number of layers having the pattern A/B/A/B, as shown in FIG. 1C, and further including at least layer 139. As with the active region in FIG. 1B, the active region in FIG. 1C can have 0, 1, 2, or more A/B layer-pairs between layer 132 and layer 138. Although not shown in FIGS. 1B–1D, it is also possible to have three pseudomorphic layers, A, B, and C, each having the form InGaPAsSb but with differing compositions, arranged in the form A/B/C/B/A between buffer/cladding layers 150a, 150b.

A further variation is shown in FIG. 1D, in which the multilayer structure 160, which includes buffer/cladding layer 150b and the pseudomorphic layers between the buffer/cladding layers, is repeated once or more times above buffer/cladding layer 150b. For buffer/cladding layers made of $GaAs_uP_{1-u}$ (0<u<1, hereinafter referred to as "GaAsP"), active region 130 could then include single or multiple layer combinations of GaAsP/A/B/ . . . /GaAsP, GaAsP/A/B/ . . . /A/GaAsP, or GaAsP/A/B/C/B/A/GaAsP. Such structures are advantageous in optimizing strain compensation (discussed below).

If the individual A/B layer thicknesses used are thin, the electrons and the holes may penetrate (quantum mechanically) through the barriers, and the discrete energy levels of the quantum wells can broaden into miniature bands. Such structures are then referred to as superlattices.

In an edge-emitting laser, the active region emits light from the side of device 100. In a resonant cavity emitter, such as a VCSEL or an LED, light is emitted from active region 130 through top portion 140 or through bottom portion 120 and substrate 110. A photodetector can receive light from the side, directly to the active region, or from the top or bottom toward the active region.

Buffer/cladding layers 150a, 150b can include thin (~400 Å) buffer layers and/or thicker (~1500 Å) cladding or graded index layers. These buffer/cladding layers may be made from GaAs, AlGaAs, or GaAsP. Buffer/cladding layers 150a, 150b act as confining layers for the electrons and holes, and also provide optical guiding. Using Al in the cladding layer can improve electron confinement. GaAsP cladding layers have tensile strain, so that it is therefore possible to compensate for the compressive strain of the InGaPAsSb layers of the active region. The compressive strain of the InGaPAsSb layers limits the thickness that may be grown pseudomorphically to a maximum thickness, known as the critical thickness. As the layer thickness increases, the misfit strain energy increases. Therefore, layers grown thicker than the critical thickness will have dislocations as the misfit strain energy accumulated over the layers exceeds the maximum allowed strain force for pseudomorphic growth. In strain compensation, the accumulated compressive strain of thin layers may be reduced or balanced by the introduction of thin layers of tensile strained material into the cladding layers. This can effectively reduce the net strain. At smaller strains, the misfit strain energy is smaller, so it is possible to grow thicker layers before dislocations occur. The use of tensile-strained cladding layers may therefore be used to increase the total thickness of the InGaPAsSb layers that may be grown pseudomorphically.

Additionally, these buffer/cladding layers should meet several requirements. First, they should have a bandgap that is larger than that of the quantum well layers in the active region. Second, their bandgap should be smallest near the well itself, and then increase further from the active region. Third, the refractive index of these layers should be largest near the well and then decrease further from the active region.

Without losing generality, an embodiment of the invention using $In_xGa_{1-x}As/GaP_rAs_sSb_{1-r-s}$ layers (as the A/B layer-pair) for the active region will be described. (This structure will hereinafter be referred to as "InGaAs/GaPAsSb.") Whereas most III/V semiconductor lasers operating at 1.3 μm and 1.55 μm use type-I QW active regions, the InGaAs/GaPAsSb structure uses a symmetrical type-II multilayer region, whose energy diagram is shown schematically in FIG. 2A. This figure shows the relative energy level as a function of the position across the active region for a three-layer active region. GaAs buffer/cladding layers are indicated by positions 205, 225, InGaAs layers by positions 210, 220, and a GaPAsSb layer by position 215. The valence band is indicated by 230 and the conduction band is indicated by 260. The first allowed hole energy level is indicated by 235, the hole barrier is indicated by 240, the first allowed electron energy level is indicated by 255, and the electron barrier is indicated by 250. The transition energy from valence band 230 to conduction band 260 is indicated by 245.

Figure 2A:
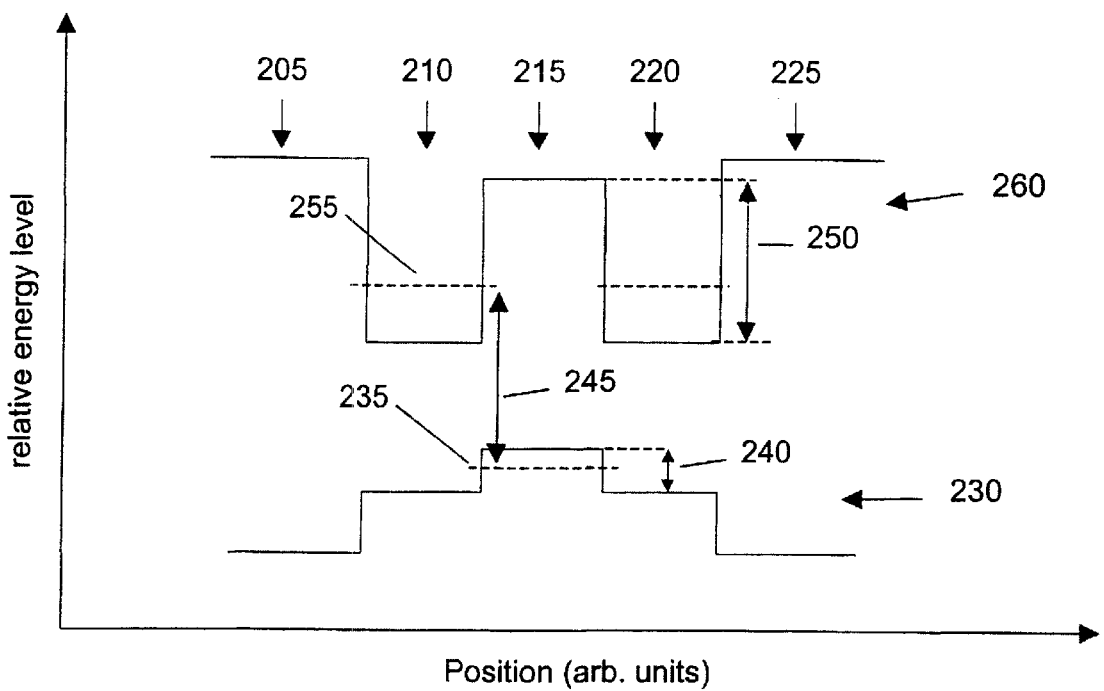
FIG. 2A is a schematic energy diagram of a band-edge alignment of an active region in accordance with an embodiment of the present invention.

In FIG. 2A, the electrons are mainly confined in InGaAs ("A") layers 210, 220 while the holes are mainly confined by GaPAsSb ("B") layer 215. Because the optical transition in type-II structures is spatially indirect, the effective bandgap can be narrower than that of the constituent materials. The thicknesses of the layers are kept sufficiently small, so that a large spatial overlap of the electron and hole wavefunctions may occur. This overlap is enhanced by using a symmetrical structure, rather than a two-layer structure, embedded in GaAs. Because the GaPAsSb layer is thin, the electron energy levels of the two electron QWs become coupled. This results in a coupled double quantum well (CDQW) structure.

Theoretical modeling based on a two-band model using the envelope wavefunction approximation can calculate the transition energies and overlaps between electron and hole wavefunctions for the type-II QW structures. Non-parabolicities for both conduction band 260 and valence band 230 have been taken into account. The band offsets have been calculated using the model-solid theory (as described in C. G. Van de Walle, Phys. Rev. B, 39, 1871 (1989)), and the effects of strain on the band structure have also been included. These calculations confirm that the band-edge alignment is type-II.

Figure 2B:
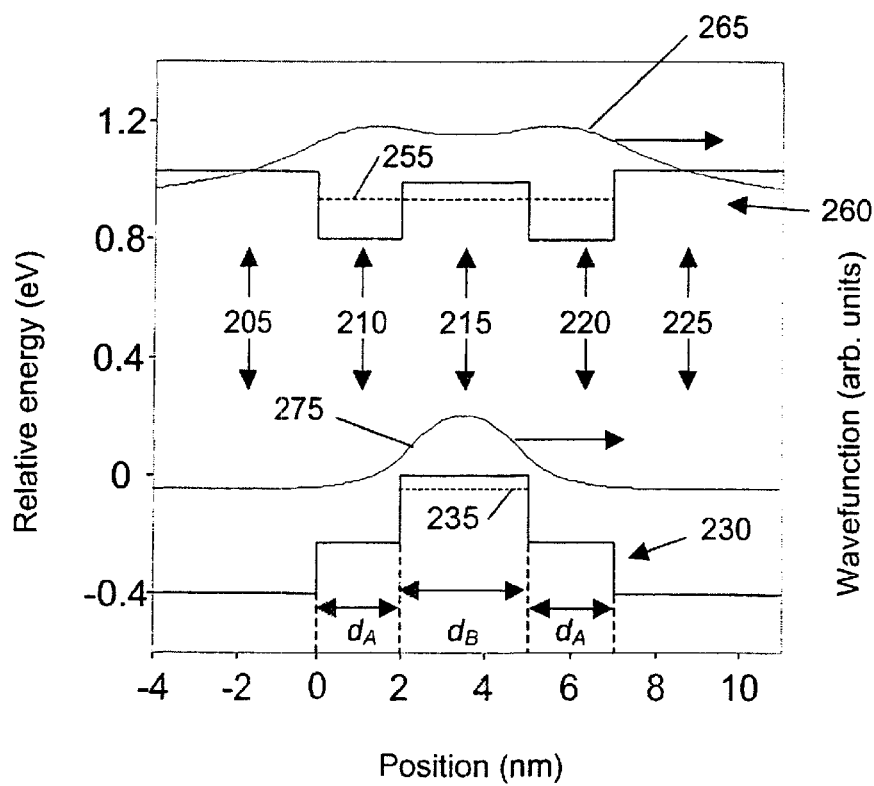
FIG. 2B is a schematic diagram of a band-edge alignment and electron and heavy-hole wavefunctions of an active region in accordance with another embodiment of the present invention.

FIG. 2B shows the calculated band-edge diagram of a CDQW structure with $In_{0.4}Ga_{0.6}As$ ("A") layer and $GaP_{0.12}As_{0.4}Sb_{0.48}$ ("B") layers. The critical thickness for the CDQW structure made of this material system is calculated to be about 7 nm based on a single-kink mechanism by the energy balance method. For layer thicknesses exceeding the critical thickness, defects may be introduced into the material, degrading the optical output and the lifetime of devices. In this example, thicknesses of 2 and 3 nm are used for the A and B layers, respectively, thus the total thickness of the active region is within the 7-nm critical thickness limit. The band-edge discontinuities and the energy levels of the electron-confined states in conduction band 260 and those of the heavy-hole-confined states in valence band 230 with no injection are plotted to scale. These calculations confirm that the band-edge alignment of the CDQW structure is type-II. Electron barrier 250 is 196 meV at the $In_{0.4}Ga_{0.6}As/GaP_{0.12}As_{0.4}Sb_{0.48}$ heterointerface. The calculated wavefunctions 265, 275 for both the electron and the hole states in the CDQW are also plotted. Heavy-hole wavefunction 275 is strongly localized in layer B 215 due to the heavy-hole effective mass. Because layer B 215 is very thin, has a low electron barrier, and possesses small electron effective mass, electron wavefunction 265 can penetrate through it, resulting in strong coupling between the two A (InGaAs) wells 210, 220. Therefore, a substantial part of electron wavefunction 265 is present in B (GaPAsSb) barrier layer 215. As a result, the electron and hole wavefunctions 265, 275 have a reasonably large overlap.

The calculated peak gains, $g_{p,\ max}$, and corresponding wavelengths, $\lambda_{gp,\ max}$, at an injected carrier concentration of $N=1\times10^{19}$ cm$^{-3}$ (157 A/cm$^2$) are shown in Table 1 for six structures with different well widths, $d_A$, $d_B$, $d_A$. $(I_{h1}{}^{e1})^2$ is the electron and hole wavefunctions overlapping integral. $N_e$ and $J_e$ are the transparent carrier concentration and transparent current density, respectively. $g_{wn}$ and $g_w$ are constants obtained by fitting the calculated gain spectra At these high injection levels, the spontaneous radiative recombination lifetime has been calculated to be $\tau_{sp}\approx2.5$ ns, and the spontaneous radiative recombination coefficient is $B_{sp}\approx4\times10^{-11}$ cm$^3$/s for these structures. For Structure 5, the transparency carrier concentration has been calculated to be approximately $5.3\times10^{18}$ cm$^{-3}$ (59 A/cm$^2$). The maximum value of the gain peak is 8008 cm$^{-1}$ under a carrier injection of $10^{19}$ cm$^3$ and occurs at a wavelength of 1.33 μm. This carrier concentration is not unreasonable for the operation of VCSELs.

TABLE 1

| Structure # | $d_A$–$d_B$–$d_A$ (nm) | $(I_{h1}^{c1})^2$ | $\lambda_{gp,max}$ ($\mu$m) | $g_{p,max}$ (cm$^{-1}$) | $g_{wn}$ (cm$^{-1}$) | $N_e$ ($10^{18}$ cm$^{-3}$) | $g_w$ (cm$^{-1}$) | $J_e$ (A/cm$^2$) |
|---|---|---|---|---|---|---|---|---|
| 1 | 2.0–2.0–2.0 | 0.507 | 1.288 | 7583 | 14076 | 5.874 | 8073 | 53.84 |
| 2 | 2.3–2.3–2.3 | 0.468 | 1.320 | 7766 | 12037 | 5.236 | 7339 | 51.86 |
| 3 | 2.5–2.5–2.5 | 0.470 | 1.314 | 7530 | 11480 | 5.162 | 6898 | 48.31 |
| 4 | 3.0–1.0–3.0 | 0.572 | 1.253 | 5616 | 9317 | 5.491 | 4684 | 33.61 |
| 5 | 2.0–3.0–2.0 | 0.469 | 1.330 | 8008 | 12635 | 5.334 | 7910 | 58.85 |
| 6 | 1.5–4.0–1.5 | 0.500 | 1.325 | 7889 | 14483 | 5.879 | 9370 | 74.50 |

Test samples and devices were grown by molecular beam epitaxy (MBE) on GaAs substrates at a growth temperature of 505° C. The samples for PL measurements were grown on a 20-period AlAs-GaAs superlattice followed by a 220 nm GaAs buffer layer, and they were capped by a 10 nm thick GaAs layer. The nominal thickness of each layer was approximately 25–30 Å, depending on layer composition and hence the layer strain, so that the critical thickness would not be exceeded. The target In composition was set between about 0.3 and 0.4.

Due to the very sensitive dependence on growth parameters, the group-V (As, P, Sb) absolute compositions are difficult to derive from experiments at this moment. The approach used to obtain one possible structure emitting at 1.3 $\mu$m is as follows. Initially, a layer sequence of $In_xGa_{1-x}As/GaAs/In_xGa_{1-x}As$ followed by GaAs is grown on a GaAs substrate at 505° C. Each of the three layers is approximately 3 nm thick. The In content x is adjusted so that both $In_xGa_{1-x}As$ layers either just reach the Stranski-Krastanov roughening transition or stay just below it. Both configurations are found to emit at roughly the same wavelength. In the next step, Sb flux is added during the growth of the central layer, and the As flux is reduced at constant total group V flux, resulting in an $In_xGa_{1-x}As/GaAs_sSb_{1-s}/In_xGa_{1-x}As$ structure. This flux ratio is adjusted in further growth experiments to the maximum possible value of Sb flux without introducing significant dislocation densities (measured by a decrease in PL intensity of the resulting structure). In the following growths, P is introduced until the maximum possible is achieved.

The fluxes of the group V elements during growth of the central $GaP_rAs_sSb_{1-r-s}$ layer are proportional to the valve settings of the elemental supply sources. An increase in one flux component also results in an increase of this component in the grown solid crystal. The dependence of the PL emission wavelength on P, As, and Sb source valve settings is shown in Table 2 and FIG. 3.

TABLE 2

| Sample | $P_{valve}$ | $As_{valve}$ | $Sb_{valve}$ | $In_{Temp}$ | $\lambda$ (nm) |
|---|---|---|---|---|---|
| B101 | 0 | 100 | 0 | 801 | 1140 |
| B114 | 50 | 40 | 250 | 795 | 1290–1320 |
| B115 | 50 | 40 | 250 | 795 | 1310 |
| B116 | 50 | 40 | 250 | 795 | 1240–1245 |
| B117 | 50 | 40 | 250 | 795 | 1270 |
| B118 | 50 | 40 | 250 | 796 | 1310–1330 |
| B120 | 70 | 40 | 250 | 796 | 1200–1260 |
| B121 | 70 | 40 | 250 | 796 | 1240–1250 |
| B122 | 70 | 40 | 250 | 796 | 1150–1160 |
| B123 | 40 | 40 | 250 | 796 | 1360–1410 |
| B124 | 30 | 40 | 250 | 796 | 1370–1410 |
| B125 | 20 | 40 | 250 | 796 | 1410–1550 |
| B126 | 40 | 40 | 200 | 796 | 1490–1520 |
| B127 | 40 | 40 | 200 | 790 | 1330–1400 |
| B132 | 40 | 40 | 250 | 796 | 1440–1490 |
| B133 | 0 | 130 | 0 | 796 | 1120–1220 |
| B134 | 40 | 40 | 200 | 785 | 1330 |
| B140* | 40 | 40 | 250 | 796 | 1300–1320 |

*For sample B140, the electroluminescence emission wavelength is quoted.

Figure 3:
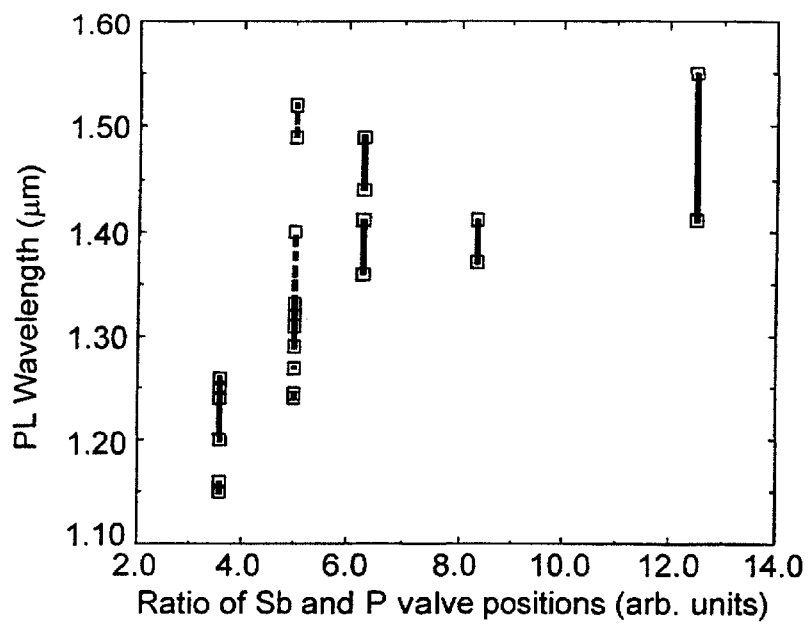
FIG. 3 is a graph showing the dependence of the photoluminescence wavelength on flux ratios of the materials of the active region layers in accordance with several embodiments of the present invention.

For the samples grown, the PL emission wavelength range (determined from the full width at half maximum of the spectra) as a function of the Sb:P valve position ratio is shown in FIG. 3. A higher Sb:P ratio means a higher Sb flux relative to the P flux, and it can be seen that the wavelength tends to increase as the Sb flux is increased relative to the P flux. The lengths of the vertical lines indicate the wavelength spread over the wafer for the fairly nonuniform deposition used. (The dashed lines indicate samples grown with a different Sb valve setting.) These data demonstrate emission from about 1100 nm to at least 1550 nm.

Figure 4:
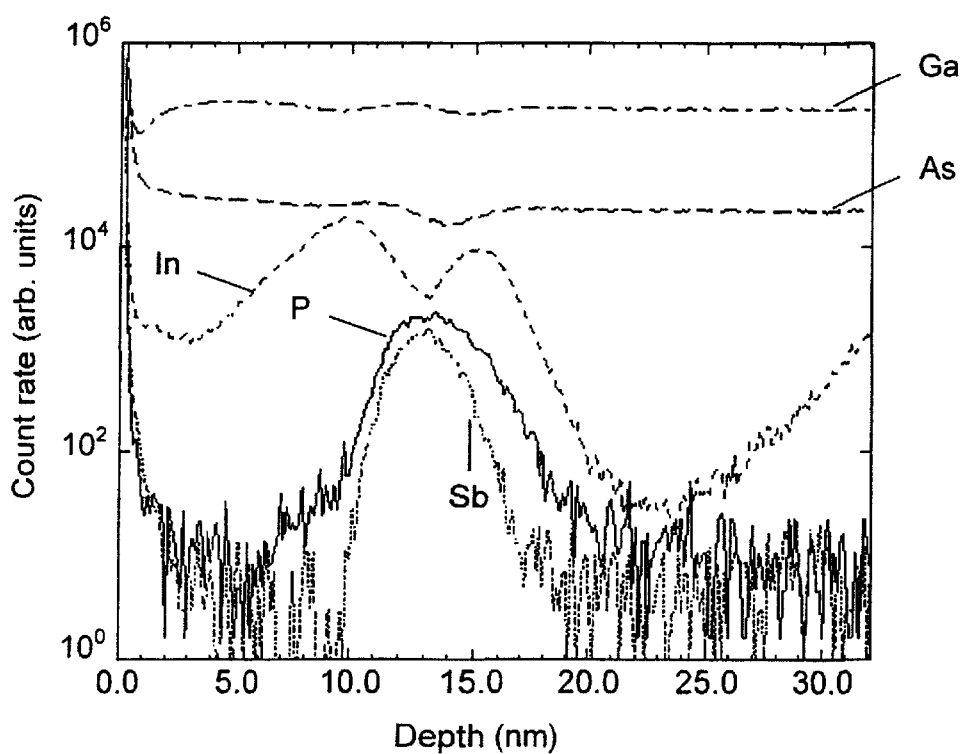
FIG. 4 is a graph showing secondary ion mass spectroscopy measurements of one embodiment of the present invention.

Although the relative changes in the different compositions can be followed to have a reproducible effect on the emission wavelength, the composition of the layers of this embodiment at present is only implicitly defined through the growth procedure. Secondary ion mass spectroscopy (SIMS) measurements of a sample of the same embodiment emitting at 1.3 $\mu$m are shown in FIG. 4. At present, there is no calibration standard to convert the ion current data into layer compositions. By multiplying the curves and adding the group-III data, one can estimate an In content after segregation of about 0.1. Significant amounts of both Sb and P are present in the central $GaP_rAs_sSb_{1-r-s}$ layer.

Generalizing from these experiments and calculations provides the following preferable composition ranges of the layer elements. For the A layer, x is between 0.05 and 0.7, y is between 0 and 0.35, z is between 0.45 and 1, and 1–y–z is between 0 and 0.25. For the B layer, q is between 0 and 0.25 and 1–r–s is between 0.25 and 1. Composition ranges are chosen using theoretical calculations. Input data include published data for bandgaps and the band offset. Strain is accounted for also. Calculations for various compositions and thicknesses are described above. Compositions are calculated with a maximum compressive strain of about 4%, so as to make the growth of thin layers practical to achieve experimentally. Thicknesses are chosen such that the material, whatever its strain, is pseudomorphic. Additionally, the estimates of the SIMS data are used. The data for calculations and the calculations themselves are widely known.

Figure 5:
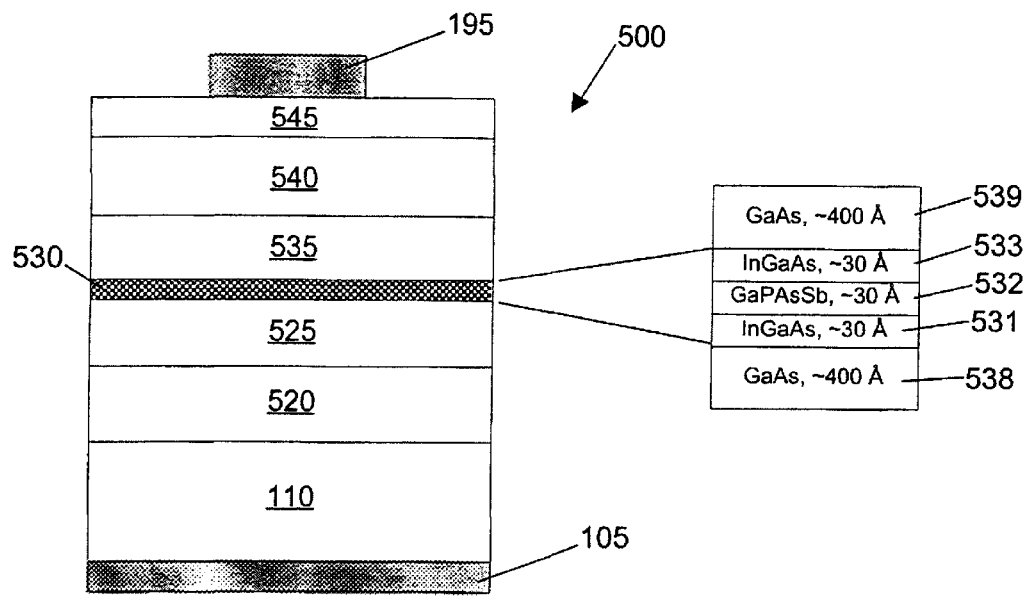
FIG. 5 is a schematic of the structure of an edge-emitting device in accordance with an embodiment of the present invention.

Electrically pumped, edge-emitting diode samples have also been grown. A schematic structure of such a device 500 is shown in FIG. 5. As in FIG. 1A, there is a bottom contact 105, a substrate 110, an active region, and a top contact 195.

Top p-contact 195 is a metal stripe contact having a width of about 80 μm. Bottom portion 120 includes contact layer 520 and graded index (GRIN) layer 525. Top portion 140 includes GRIN 535, contact layer 540, and capping layer 545. As noted preferentially with respect to FIG. 1A, the bottom portion of device 500 is n-doped, and the top portion is p-doped. In this example, substrate 110 is n-GaAs. Contact layers 520 and 540 are approximately 16,000 Å thick and preferably comprise n-$Al_{0.65}Ga_{0.35}As$ and p-$Al_{0.65}Ga_{0.35}As$, respectively, although other composition percentages are suitable. Capping layer 545 is p-doped and is deposited to prevent the underlying structure, which usually contains Al, from large area exposure to air. Capping layer 545 is approximately 2000 Å thick and is preferably made of GaAs. GRIN layers 525, 535 are approximately 1500 Å thick and comprise undoped $Al_xGa_{1-x}As$, where x preferably goes from 0.65 at the interfaces with contact layers 520, 540 to 0.25 at the interfaces with active region 530. GRIN layers 525, 535 are also known as guiding layers because they provide optical confinement of light generated in the active region. They are usually undoped.

Active region 530 comprises a three-layer, InGaAs/GaPAsSb/InGaAs structure 531, 532, 533 with GaAs buffer layers 538, 539. Like the GRIN layers, the active region is normally undoped. Active region 530 includes three layers each having a nominal thickness of 30 Å. GaAs buffer layers 538, 539 are approximately 400 Å thick. The GRIN layers 525, 535 and the contact layers 520, 540 allow current to pass through the active region. The cavity length for device 500 is approximately 750 μm.

Figure 6:
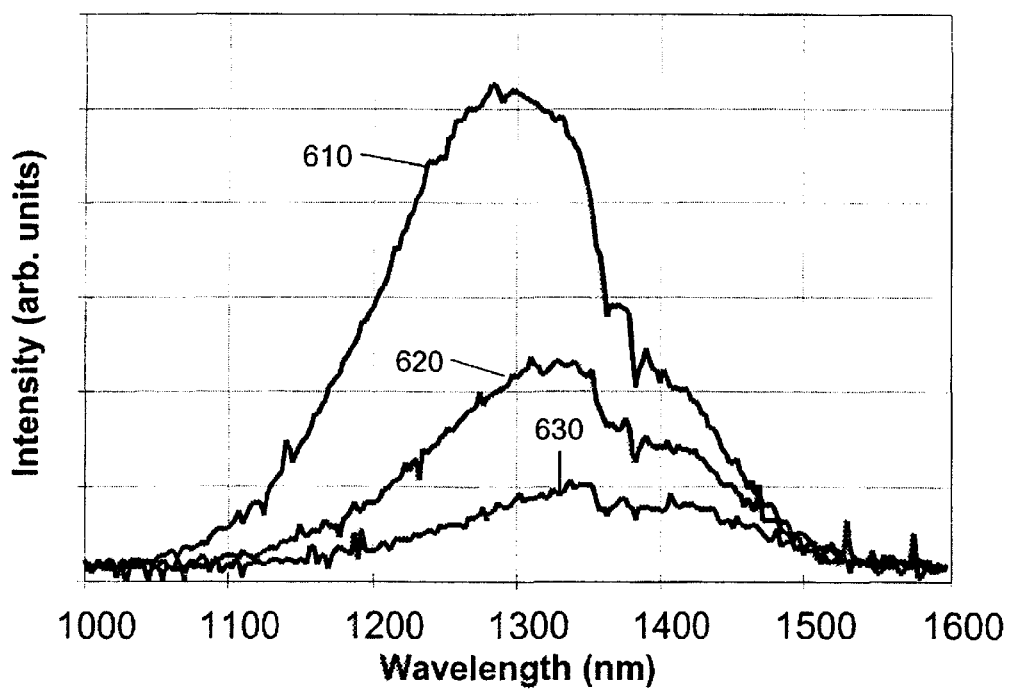
FIG. 6 is a graph showing electroluminescence spectra of an edge-emitting device similar to that of FIG. 5.

FIG. 6 shows room-temperature optical spectra of an electrically-pumped device operating at a range of current densities between about 175 A/cm$^2$ to about 700 A/cm$^2$, corresponding to injection currents of 100 mA to 400 mA. The pulse duration is 10 μs, and the duty cycle is 10%. For a maximum injection current of 400 mA, strong PL at 1.3 μm is obtained for this device as shown in trace 610. For this broad area device, as the injection current decreases to 200 mA (350 A/cm$^2$) and 100 mA (175 A/cm$^2$), the room-temperature optical spectra shift to longer wavelengths (approximately 1325 nm and 1350 nm), as shown by traces 620 and 630, respectively. The shorter wavelength at higher bias currents is primarily attributed to the band-filling of lower energy states which arise from thickness and compositional fluctuations within InGaAs layers 531, 533 and GaPAsSb layer 532. Gain saturation of the small volume active-region may also occur.

Room temperature PL measurements were made on samples using the 514 nm line of an argon-ion laser for optical excitation. This light, incident on the epitaxially grown surface of the samples, is absorbed by the semiconductor material, and emission then occurs as the optically excited electrons fall back to the valence band, recombining with holes, to cause emission of light with a characteristic wavelength determined by the bandgap properties of the active material. FIG. 7A shows a PL measurement for a sample displaying strong emission close to 1.3 μm, with measurements taken on each wafer at the center (bottom trace), half way to the edge (middle trace), and at the edge (top trace). By changing the composition of the GaPAsSb layer in accordance with TABLE 2, PL emission at wavelengths up to 1.5 μm has been demonstrated. This may be seen in FIG. 7B and was achieved by increasing the flux of the Sb cell relative to that of the P cell. The variation of the peak wavelength across the wafer is due to a non-uniform flux distribution from the cells.

Reflection high energy electron diffraction (RHEED) measurements during the growth of the structures indicate a different surface arrangement during the growth of the central (In)GaPAsSb ("B") layer. This may be seen in FIG. 8 for two samples—B126 in frames f & g and B124 in frame f. In strong contrast to the preceding and following layers, the diffraction spot in the diffraction pattern is more elongated parallel to the sample surface then perpendicular to it. This may indicate an ordered surface structure, in which either the group-III sublattice or the group-V sublattice, or both, show domains of spontaneous ordering. This means that either In and Ga or the group-V elements exhibit a repetitive alternating arrangement along the crystal lattice. Ordering of this type has been observed previously in many similar materials systems like GaInAs, GaAsSb, GaAsSb and InAsSb in MBE and usually leads to a decrease in the bandgap energy compared to disordered material. This additional parameter may be used to influence and tune the emission wavelength of optoelectronic devices realized with the said device structure.

Figure 9:
FIG. 9 is an electron micrograph showing the cross-section of an active region of an embodiment fabricated in accordance with the present invention.

Transmission electron microscopy observations of cross-sectional samples have been carried out to characterize the layer structure of the samples. FIG. 9 shows a dark-field transmission electron micrograph obtained for a sample. This image clearly shows two well-defined interfaces with a separation of approximately 9.0 nm, which is in excellent agreement with the total thickness determined from the growth rate for the InGaAs/GaPAsSb QW structure. This finding demonstrates that the as-grown sample indeed has a QW structure. The top InGaAs/GaAs interface shows a certain degree of roughness, which is consistent with the RHEED observation. However, this roughness does not provide substantial additional lateral quantum confinement as is the case for conventional quantum dots, in which electrons are confined in a three-dimensional dot. The interfaces between the InGaAs layers and the GaPAsSb layer are not very well defined in the electron micrographs. This is due at least partially to the lack of contrast between the different group-V element atoms. Inhomogeneous strain contrast is also visible extending into the GaAs cladding layers on either side of the QW. The strain field variations are believed to result from thickness and compositional variations within the QW itself Electron micrographs of a second sample showed undulating contrast within the QW structure, confirming these variations. High resolution lattice imaging showed no visible sign of structural defects.

Figures 10A, 10B:
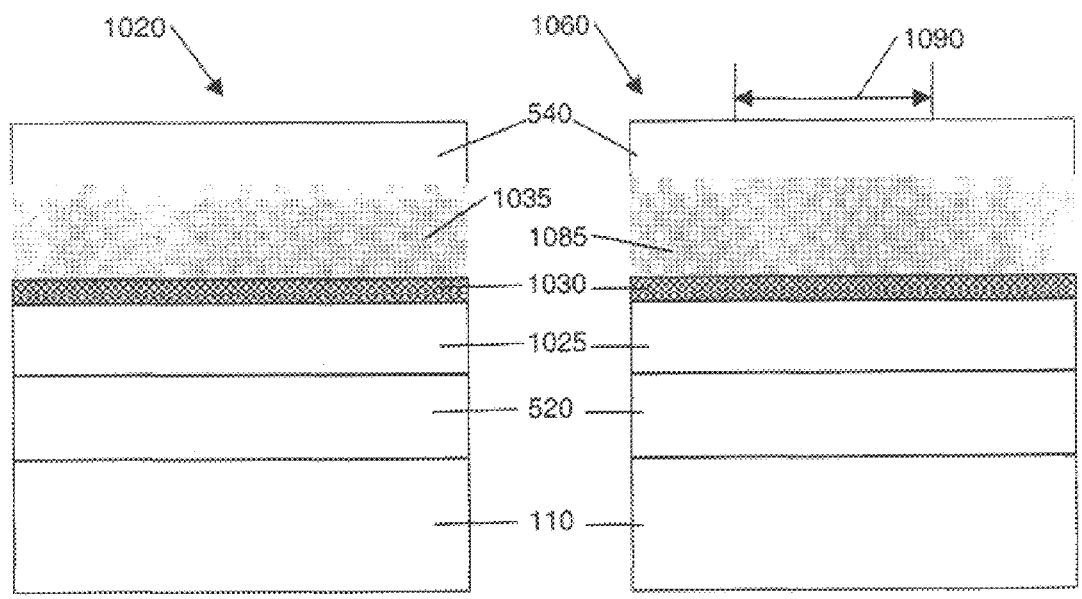
FIGS. 10A and 10B are schematic diagrams of the structures of edge-emitting devices in accordance with another embodiment of the present invention.

The present invention can be incorporated in a number of different optoelectronic devices. Several variations of edge-emitting device 500 may incorporate the present invention, including distributed feedback (DFB) lasers and distributed Bragg reflector (DBR) lasers. FIGS. 10A and 10B depict DFB laser 1020 and DBR laser 1060, respectively, each having a periodic grating in the top portion of the device. The gratings have lines that extend over at least part of the active region. Both devices include substrate 110, n-contact layer 520, guiding layer 1025, and p-contact layer 540. DFB 1020 includes guiding layer 1035 which includes a periodic grating. DBR 1060 includes guiding layer 1085 which includes a different periodic grating. Also shown in DBR 1060 is pumping region 1090, in which the laser pumping occurs. The period of the gratings defines a cavity resonance at a wavelength of λ (in microns), which is defined as 1.24 divided by the resonance energy (in eV). The resonance energy should fall within the gain spectrum of the active region material, and it should be chosen to be close to the transition energy of the active region.

Figures 11A, 11B:
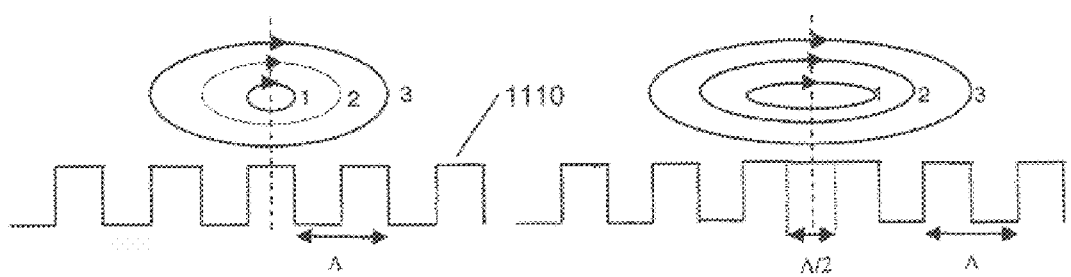
FIGS. 11A and 11B are schematic diagrams of periodic structures with rectangular gratings.

Devices 1020 and 1060 are shown with rectangular gratings, which are further described in FIGS. 11A and 11B. This grating shape is shown as an example only and other grating shapes are possible. As shown in FIG. 11A, rectangular grating 1110 has period Λ, and individual interface reflections 1, 2, 3 are shown. The physical length of a layer is λ/4n, where n is the refractive index of the layer. The optical path length of a layer is λ/4 (Λ/2). The phase change traversing a layer once is given by π/2, and the round trip phase for a single layer is π. The signs of the interface reflections alternate due to the change in the refractive index going from one layer to the next. All the reflected waves will add in phase, but the roundtrip phase for each wave is (2m+1) π, where m is an integer. In FIG. 1B, a phase-shifting element is added, with optical path length λ/4. This introduces an additional phase shift of π into each round trip, yielding a total roundtrip phase which is an integral multiple of 2π.

Figure 12:
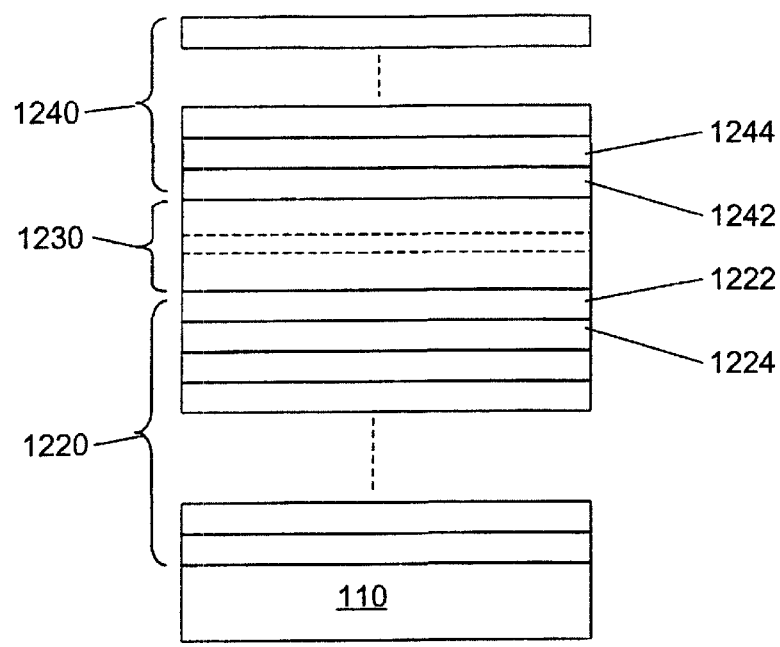
FIG. 12 is a schematic diagram of a resonant cavity structure in accordance with several embodiments of the present invention.

The present invention may be incorporated into resonant cavity structures, such as resonant cavity photodiodes (RCPD), resonant cavity LEDs (RCLED), or VCSELs. A schematic of a generic resonant cavity structure is shown in FIG. 12. It includes substrate 110, bottom mirror 1220, top mirror 1240, and region 1230, which includes the active region (bounded by the dashed lines) and the GRIN layers. The mirrors 1220, 1240 are made of mirror pairs of alternating high and low refractive index material. The number of mirror pairs will vary between different device types, but schematically, the layer structure is the same. In top mirror 1240, low refractive index material 1242 is adjacent region 1230, and high refractive index material 1244 is disposed on layer 1242. Similarly, in bottom mirror 1220, low refractive index material 1222 is adjacent region 1230, and layer 1222 is disposed on high refractive index material 1224.

When grown on GaAs substrates, the mirrors may be formed from high and low refractive index dielectric materials, such as $TiO_2$ and $SiO_2$, respectively, which are used for example only. Other well known dielectric materials also exist. The high and low refractive index material may be pseudomorphic semiconductor, $Al_xGa_{1-x}As$ and $Al_yGa_{1-y}As$, respectively, where y>x. For semiconductors, the lower refractive index material may also be oxidized $Al_yGa_{1-y}As$, where y is usually larger than 0.9 and x is chosen so that the material does not oxidize. High and low refractive index polymeric material may also be used. Combinations of any of the above low and high refractive index materials may also be used.

The thickness of the mirror layers is usually chosen to be λ/4. This defines a cavity resonance at a wavelength of λ (in microns), which is defined to be 1.24 divided by the resonance energy (in eV). The resonance energy should fall within the gain spectrum of the active region material. It should be chosen to be close to the transition energy of the active region.

Figure 13A:
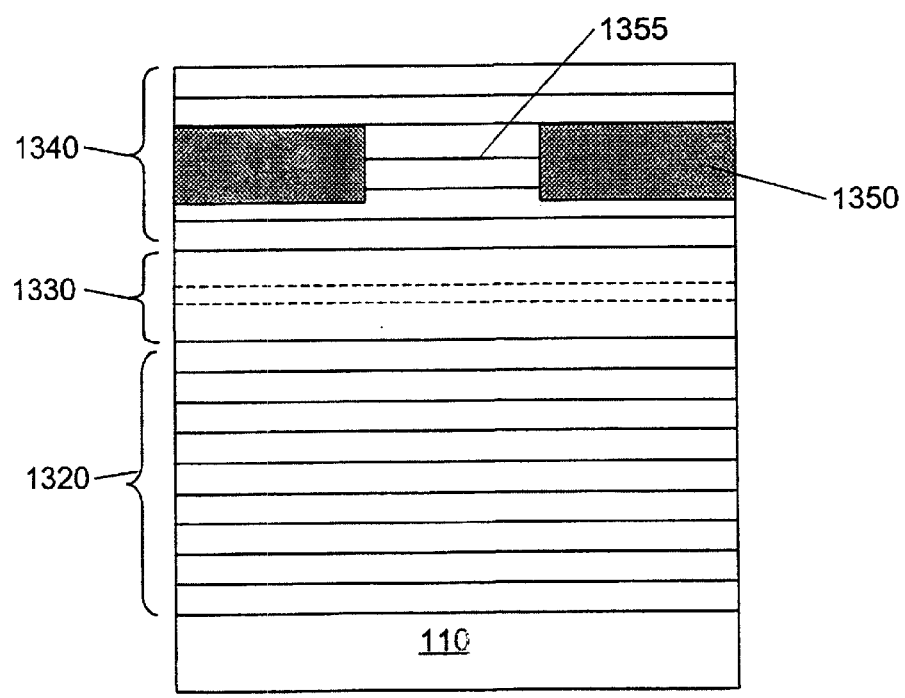
FIGS. 13A–13C are schematic diagrams of guided aperture VCSELs in accordance with several embodiments of the present invention.

These resonant cavity structures can use apertures disposed above the active region to guide the optical mode. The apertures preferably have two regions. FIG. 13A is a schematic of a gain-guided VCSEL, which includes a gain-guided aperture. This VCSEL includes substrate 110, bottom mirror 1320, top mirror 1340, and region 1330, which includes the active region and the GRIN layers. The aperture has two regions, high resistivity region 1350 and low resistivity region 1355. Current flows through low resistivity region 1355 into the active region. High resistivity region 1350 is formed by proton or ion implantation, but current cannot flow through this region. This device provides lateral confinement of the gain region, where the optical mode will then form.

Figure 13B:
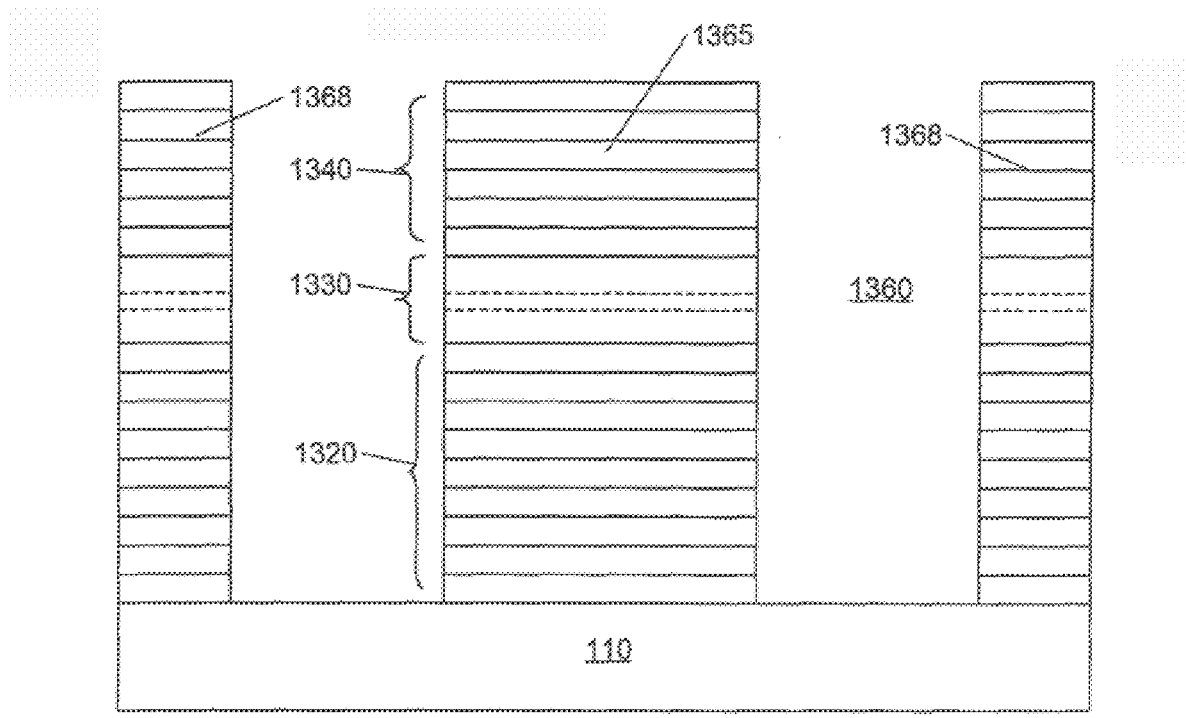

A second type of aperture device, a refractive-index-guided aperture, is shown in FIG. 13B. As with the device in FIG. 13A, this device includes substrate 110, bottom mirror 1320, top mirror 1340 and region 1330, which includes the active region and the GRIN layers. The aperture in this device has two regions, low refractive index region 1360 and high refractive index region 1365. Low refractive index region 1360 may be formed by etching away material to form a pillar structure. Low refractive index region 1360 may be air, as shown in FIG. 13B, having a lower refractive index than that of the pillar, but could also be something like a polymer, for example, or other material with refractive index less than that of the pillar. Adjacent low refractive index regions 1360 on the sides opposite the pillar is unprocessed material 1368, which is not considered part of the device. Light is confined to the high refractive index region and current is confined to the pillar.

Figure 13C:
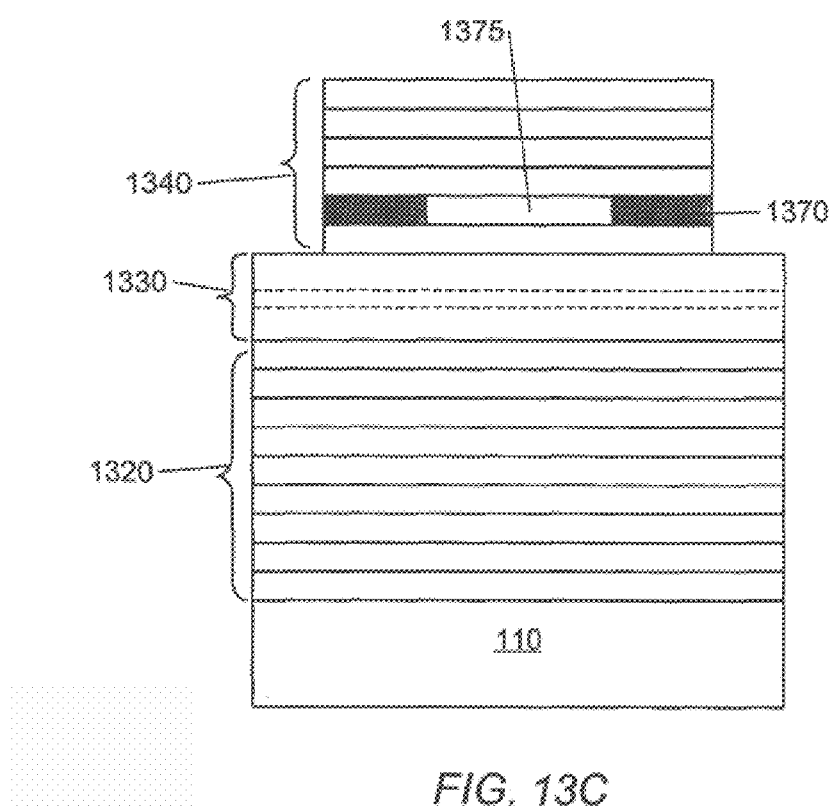

A third type of aperture device, an oxide-based or oxide-confined aperture, is shown in FIG. 13C. As with the devices in FIGS. 13A and 13B, this device includes substrate 110, bottom mirror 1320, top mirror 1340, and region 1330, which includes the active region and the GRIN layers. The aperture in this device has two regions, oxidized region 1370 and less-oxidized region 1375. Oxidized region 1370 is highly oxidized and may comprise $Al_yGa_{1-y}As$, where y is greater than 0.9. Less-oxidized region 1375 is semiconductor material, such as $Al_xGa_{1-x}As$, where x is less than 0.8, which is unoxidized or oxidized to a lesser extent than oxidized region 1370. Oxidized region 1370 has (a) low refractive index and (b) high resistivity, and therefore provides both optical and electrical confinement. An oxide-confined aperture can have very low threshold currents.

The invention herein described includes an active region disposed over a semiconductor substrate. The active region includes at least two pseudomorphic layers having the form $In_xGa_{1-x}P_yAs_zSb_{1-y-z}/In_qGa_{1-q}P_rAs_sSb_{1-r-s}$. Structures incorporating this active region have been shown to emit at wavelengths from 1.1 μm to more than 1.5 μm, suitable for many telecommunications applications. Growing $In_xGa_{1-x}$, $P_yAs_zSb_{1-y-z}/In_qGa_{1-q}P_rAs_sSb_{1-r-s}$ quantum wells (QWs), where the stoichiometry of the layers is different, on GaAs or AlGaAs substrates avoids the limitation of having the lasing wavelength determined by the bandgap of a single material. The invention shifts the peak of the photoluminescence (PL) emission spectrum from 1.1 μm to 1.5 μm, depending on the compositions of the $In_xGa_{1-x}P_yAs_zSb_{1-y-z}$ and $In_qGa_{1-q}P_rAs_sSb_{1-r-s}$ layers. Theoretical modeling shows that the proposed QW structure has a type-II band-edge alignment, in which the electron and hole wavefunctions have a large spatial overlap.

Although the present invention has been described in detail, it should be understood that various changes, substitutions, and alterations can be made hereto without departing from the spirit and scope of the invention as defined by the appended claims.

We claim:

1. A compound semiconductor device with a wavelength of operation, comprising:
   a substrate; and
   an active region disposed above the substrate, the active region comprising at least first and second adjacent pseudomorphic layers,
   wherein:
      the first pseudomorphic layer has the form $In_xGa_{1-x}P_yAs_zSb_{1-y-z}$ and includes at least In, Ga, and As;
      the second pseudomorphic layer has the form $In_xGa_{1-x}P_yAs_zSb_{1-y-z}$ and includes at least Ga, As, and Sb; and the compositions of the first and second pseudomorphic layers are different such that the wavelength of operation is substantially determined by the compositions of the first and second pseudomorphic layers.

2. The device according to claim 1, wherein the substrate comprises GaAs or $Al_pGa_{1-p}As$, wherein $0<p<1$.

3. The device according to claim 1, wherein the substrate has a lattice constant close to or equal to the lattice constant of GaAs.

4. The device according to claim 1, wherein:
$0<y\leq0.35$;
$0.45\leq z<1$;
$0<1-y-z\leq0.25$;
$0<q\leq0.25$; and
$0<r<1$.

5. The device according to claim 1, wherein a band structure is formed between the first and second pseudomorphic layers, the band structure having a type-II band-edge alignment.

6. The device according to claim 1, wherein the peak transition wavelength is greater than 1100 nm.

7. The device according to claim 1, wherein the first pseudomorphic layer is a well region for electrons and the second pseudomorphic layer is a barrier region for electrons.

8. The device according to claim 1, wherein the first and second pseudomorphic layers form quantum wells.

9. The device according to claim 1, wherein the first and second pseudomorphic layers form a superlattice.

10. The device according to claim 1, wherein the active region further comprises a third pseudomorphic layer disposed above the second pseudomorphic layer, the composition of the third pseudomorphic layer being substantially the same as the composition of the first pseudomorphic layer.

11. The device according to claim 10, further comprising a fourth pseudomorphic layer disposed above the third pseudomorphic layer, wherein the composition of the fourth pseudomorphic layer is substantially the same as the composition of the second pseudomorphic layer.

12. The device according to claim 1, further comprising at least one layer-pair disposed between the second and third pseudomorphic layers, each layer-pair comprising a first additional pseudomorphic layer having substantially the same composition as the first pseudomorphic layer and a second additional pseudomorphic layer having substantially the same composition as the second pseudomorphic layer.

13. The device according to claim 10, further comprising at least one layer-pair disposed between the second and third pseudomorphic layers, each layer-pair comprising a first additional pseudomorphic layer having substantially the same composition as the first pseudomorphic layer and a second additional pseudomorphic layer having substantially the same composition as the second pseudomorphic layer.

14. The device according to claim 1, wherein the active region further comprises:

a third pseudomorphic layer disposed on the second pseudomorphic layer, the composition of the third pseudomorphic layer being different from the compositions of the first and second pseudomorphic layers;

a fourth pseudomorphic layer disposed on the third pseudomorphic layer, the composition of the fourth pseudomorphic layer being substantially the same as the composition of the second pseudomorphic layer; and a fifth pseudomorphic layer disposed on the fourth pseudomorphic layer, the composition of the fifth pseudomorphic layer being substantially the same as the composition of the first pseudomorphic layer.

15. The device according to claim 1, further comprising first and second cladding layers surrounding the active region.

16. The device according to claim 15, wherein the cladding layers comprise GaAs, $Al_tGa_{1-t}As$, or $GaAs_uP_{1-u}$, and wherein $0<t<1$ and $0<u<1$.

17. The device according to claim 15, wherein the first pseudomorphic layer is disposed above the first cladding layer and the second pseudomorphic layer is disposed on the first pseudomorphic layer.

18. The device according to claim 17, wherein the active region further comprises a third pseudomorphic layer disposed on the second pseudomorphic layer, the composition of the third pseudomorphic layer being substantially the same as the composition of the first pseudomorphic layer.

19. The device according to claim 18, further comprising a fourth pseudomorphic layer disposed above the third pseudomorphic layer, wherein the composition of the fourth pseudomorphic layer is substantially the same as the composition of the second pseudomorphic layer.

20. The device according to claim 19, further comprising at least one layer-pair disposed between the second and third pseudomorphic layers, each layer-pair comprising a first additional pseudomorphic layer having substantially the same composition as the first pseudomorphic layer and a second additional pseudomorphic layer having substantially the same composition as the second pseudomorphic layer.

21. The device according to claim 18, further comprising at least one layer-pair disposed between the second and third pseudomorphic layers, each layer-pair comprising a first additional pseudomorphic layer having substantially the same composition as the first pseudomorphic layer and a second additional pseudomorphic layer having substantially the same composition as the second pseudomorphic layer.

22. The device according to claim 1, further comprising:

a first cladding layer disposed between the substrate and the active region; and a second cladding layer disposed above the second pseudomorphic layer.

23. The device according to claim 22, wherein the second cladding layer and the layers disposed between the first and second cladding layers comprise a first multilayer structure, and wherein at least one additional multilayer structure substantially identical to the first multilayer structure is disposed over the first multilayer structure.

24. The device according to claim 1, further comprising:

a conductive layer of a first conductivity type electrically coupled to the active region;

a second conductive layer of a second conductivity type electrically coupled to the active region; and means for providing or extracting electrical current to or from the active region.

25. The device according to claim 24, wherein the bandgap of the conductive layers is larger than that of the layers in the active region.

26. The device according to claim 24, wherein a cavity in the plane of the conductive layers is formed by etching or cleaving to form a semiconductor-air interface, and optical emission or absorption is achieved via the semiconductor-air interface.

27. The device according to claim 24, further comprising a grating layer disposed above the second conductive layer, wherein the grating layer has lines that extend over at least part of the active region, the grating layer defining an optical resonance cavity having a resonance wavelength corresponding to a resonance energy,
wherein the resonance wavelength (in microns) as measured in a vacuum equals 1.24 divided by the resonance energy (in electron volts).

28. The device according to claim 27, wherein the lines of the grating layer are shifted by at least one quarter wavelength, or a multiple of a quarter wavelength, to form a phase-shifted grating layer.

29. The device according to claim 24, further comprising a bottom mirror disposed beneath the active region and a top mirror disposed above the active region, wherein the top and bottom mirrors define an optical resonance cavity having a resonance wavelength corresponding to a resonance energy,
wherein the resonance wavelength (in microns) as measured in a vacuum equals 1.24 divided by the resonance energy (in electron volts).

30. The device according to claim 29, wherein the bottom mirror comprises alternating high refractive index layers and low refractive index layers.

31. The device according to claim 30, wherein the low refractive index layers are selected from the group consisting of oxidized material, low refractive index dielectric material, low refractive index polymeric material, and relatively low refractive index semiconductor material.

32. The device according to claim 30, wherein the high refractive index layers are selected from the group consisting of oxidized material, high refractive index dielectric material, high refractive index polymeric material, and high refractive index semiconductor material.

33. The device according to claim 29, wherein the top mirror comprises alternating high refractive index layers and low refractive index layers.

34. The device according to claim 33, wherein the low refractive index layers are selected from the group consisting of oxidized material, low refractive index dielectric material, low refractive index polymeric material, and relatively low refractive index semiconductor material.

35. The device according to claim 33, wherein the high refractive index layers are selected from the group consisting of oxidized material, high refractive index dielectric material, high refractive index polymeric material, and high refractive index semiconductor material.

36. The device according to claim 29, further comprising an aperture disposed above the active region, the aperture having first and second regions.

37. The device according to claim 36, wherein the first aperture region has a high electrical resistance and the second aperture region has a much lower electrical resistance.

38. The device according to claim 36, wherein the first aperture region has a lower refractive index than the second aperture region.

39. The device according to claim 36, wherein the first aperture region comprises predominantly oxidized material and the second aperture region is oxidized less than the first aperture region.

40. The device according to claim 36, wherein the aperture is formed by etching a pillar.

41. The device according to claim 36, wherein the device is a resonant cavity photodetector.

42. The device according to claim 36, wherein the device is a resonant cavity light-emitting diode.

43. The device according to claim 36, wherein the device is a vertical-cavity surface-emitting laser.

44. An edge-emitting device with a wavelength of operation comprising:
a substrate; and
an active region disposed above the substrate, the active region comprising at least first and second adjacent pseudomorphic layers,
wherein:
the first pseudomorphic layer has the form $In_xGa_{1-x}P_yAs_zSb_{1-y-z}$ and includes at least In, Ga, and As;
the second pseudomorphic layer has the form $In_xGa_{1-x}P_yAs_zSb_{1-y-z}$ and includes at least Ga, As, and Sb; and
the compositions of the first and second pseudomorphic layers are different such that the first pseudomorphic layer forms a potential well for a carrier type and a potential barrier for an opposite carrier type and the second pseudomorphic layer forms a potential well for the opposite carrier type and a potential barrier for the carrier type wherein the wavelength of operation is substantially determined by the compositions of the first and second pseudomorphic layers.

45. A resonant cavity photodetector comprising:
a substrate; and
an active region disposed above the substrate, the active region comprising a first pseudomorphic layer positioned on a second pseudomorphic layer,
wherein:
the first pseudomorphic layer has the form $In_xGa_{1-x}P_yAs_zSb_{1-y-z}$ and includes at least In, Ga, and As;
the second pseudomorphic layer has the form $In_xGa_{1-x}P_yAs_zSb_{1-y-z}$ and includes at least Ga, As, and Sb; and
the compositions of the first and second pseudomorphic layers are different.

46. A resonant-cavity light emitting diode comprising:
a substrate; and
an active region disposed above the substrate, the active region comprising alternating layers of a first and second pseudomorphic layer,
wherein:
the first pseudomorphic layer has the form $In_xGa_{1-x}P_yAs_zSb_{1-y-z}$ and includes at least In, Ga, and As;
the second pseudomorphic layer has the form $In_xGa_{1-x}P_yAs_zSb_{1-y-z}$ and includes at least Ga, As, and Sb; and
the first pseudomorphic layer forms a potential well for a negative charge and the second pseudomorphic layers forms a potential well for a positive charge.

47. A vertical-cavity surface-emitting laser with a wavelength of operation comprising:
a substrate; and
an active region disposed above the substrate, the active region comprising at least first and second adjacent pseudomorphic layers,
wherein:
the first pseudomorphic layer has the form $In_xGa_{1-x}P_yAs_zSb_{1-y-z}$ and includes at least In, Ga, and As;
the second pseudomorphic layer has the form $In_xGa_{1-x}P_yAs_zSb_{1-y-z}$ and includes at least Ga, As, and Sb; and
the compositions of the first and second pseudomorphic layers are different such that the wavelength of operation is substantially determined by the compositions of the first and second pseudomorphic layers.

* * * * *